(12) United States Patent
Schlehahn

(10) Patent No.: US 11,686,999 B2
(45) Date of Patent: Jun. 27, 2023

(54) METHOD FOR PRODUCING A RADIATION-EMITTING COMPONENT, AND RADIATION-EMITTING COMPONENT

(71) Applicant: OSRAM OLED GmbH, Regensburg (DE)

(72) Inventor: Alexander Schlehahn, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 301 days.

(21) Appl. No.: 16/769,833

(22) PCT Filed: Nov. 29, 2018

(86) PCT No.: PCT/EP2018/083029
§ 371 (c)(1),
(2) Date: Jun. 4, 2020

(87) PCT Pub. No.: WO2019/110419
PCT Pub. Date: Jun. 13, 2019

(65) Prior Publication Data
US 2020/0371434 A1    Nov. 26, 2020

(30) Foreign Application Priority Data

Dec. 5, 2017   (DE) .......................... 102017128824.4

(51) Int. Cl.
*G03F 7/00* (2006.01)
*G03F 7/09* (2006.01)
(Continued)

(52) U.S. Cl.
CPC ...... *G03F 7/0005* (2013.01); *B29D 11/00009* (2013.01); *G03F 7/0037* (2013.01); *G03F 7/095* (2013.01); *G03F 7/2053* (2013.01)

(58) Field of Classification Search
CPC ................................................ B29D 11/00009
See application file for complete search history.

(56) References Cited

U.S. PATENT DOCUMENTS 3,932,184 A  *  1/1976  Cohen ................... G03F 7/0005
                                              430/22
4,920,075 A  *  4/1990  Morita .............. H01L 27/14627
                                              438/257

(Continued)

FOREIGN PATENT DOCUMENTS

DE    3782783 T2    4/1993
DE    60114820 T2    9/2006
(Continued)

OTHER PUBLICATIONS

Kelkar et al. "Nanopatterning on optical fiber and laser diode facet with dry resist" J. Vac. Sci Technol. A vol. 22 pp. 743-746 (2004).*
(Continued)

*Primary Examiner* — Martin J Angebranndt
(74) *Attorney, Agent, or Firm* — MH2 Technology Law Group LLP

(57) ABSTRACT

The invention relates a method for producing a radiation-emitting component including a step A, in which a laser having an optical resonator and an output mirror is provided, wherein during the intended operation, laser radiation exits the optical resonator via the output mirror. In a step B), a photoresist layer is applied to the output mirror. In a step C), an optical structure is generated from the photoresist layer by means of a 3D lithography method, wherein the optical structure is designed to influence the beam path of the laser radiation by refraction and/or reflection.

15 Claims, 5 Drawing Sheets

Figure 1A:
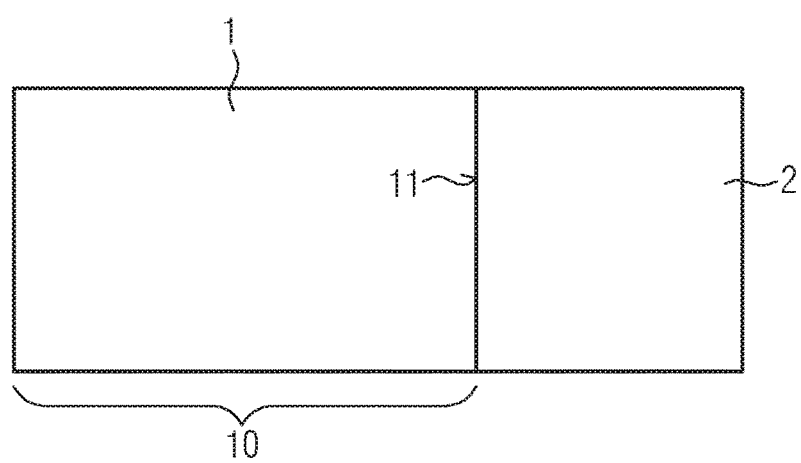

(51) Int. Cl.
  *G03F 7/20* (2006.01)
  *B29D 11/00* (2006.01)
  *G03F 7/095* (2006.01)

(56) References Cited

U.S. PATENT DOCUMENTS

| | | | | |
|---|---|---|---|---|
| 5,728,509 | A | * 3/1998 | Eda | G02B 6/1245 |
| | | | | 216/26 |
| 5,912,913 | A | * 6/1999 | Kondow | H01S 5/18341 |
| | | | | 372/50.1 |
| 6,121,983 | A | * 9/2000 | Fork | H04N 1/192 |
| | | | | 359/224.1 |
| 2013/0177697 | A1 | * 7/2013 | Atta | B05D 5/063 |
| | | | | 118/696 |
| 2013/0315530 | A1 | 11/2013 | La Porta et al. | |
| 2016/0072585 | A1 | * 3/2016 | Halderman | G02B 6/138 |
| | | | | 398/141 |
| 2016/0356971 | A1 | * 12/2016 | de Jong | G02B 6/4243 |

FOREIGN PATENT DOCUMENTS

| | | | |
|---|---|---|---|
| DE | 102015012980 | A1 | 4/2017 |
| DE | 102016214606 | B3 | 8/2017 |
| DE | 102016221464 | A1 | 5/2018 |
| EP | 2916151 | A1 | 9/2015 |
| JP | 01-161792 | * | 6/1989 |
| JP | 09-243869 | * | 9/1997 |
| JP | 2004072004 | A * | 3/2004 ........... G02B 6/4206 |
| JP | 2004118918 | A * | 4/2004 |
| JP | 2007008004 | A | 1/2007 |
| WO | 2015134566 | A1 | 9/2015 |
| WO | 2018083191 | A1 | 5/2018 |

OTHER PUBLICATIONS

Thomas et al., "In situ fabricated 3D micro-lenses for photonic integrated circuits" Opt. Express. vol. 26(10) pp. 13436-13442 (May 2018).*
Li et al., "Direct integration of aspherical microlens on vertical-cavity surface emitting surface for beam shaping", Opt. Commun. vol. 300 pp. 260-273 (2013).*
Machine translation of JP 01-161792 (1989).*
Thiele et al., Ultra-compact on-chip LED collimation optics by 3D femtosecond direct laser writing,Opt. Lett., vol. 41(13) pp. 3029-3032 (Jul. 2016).*
Kroner "Integrated focusing photoresist microlenses on AlGaAs top-emitting VCSELs", Annual report 2004, optoelectronic department, Univ. Ulm (6 pages) (2004).*
Zukauskas et al., "Improvement of the fabrication accuracy of fiber tip microoptical components via mode field expansion", JLMN vol. 9(1) pp. 68-72 (2014).*
Lindenmann et al., "Photonic wire bonding: A novel concept for chip-scale interconnects". Opt. Expr. vol. 20(16) pp. 17667-17677 (Jul. 2012).*
Meyer et al., "Manufacturing and characterization of femtosecond laser-inscribed Bragg grating in polymer waveguide operation in an IR-A wavelength range", Sensors , 20 249 (17 pages (2020).*
Gissibl et al., "Two-photon direct laser writing of ultracompact multi-lens objectives", Nature Photonics, Jun. 27, 2016, 7 pages.
Joshi et al., "Three-dimensionaloptical circuitryusing two-photon-assisted polymerization", Applied Physics Letters, No. 74, vol. 170, 1999, 4 pages.
Fischbach et al., "Single Quantum Dot with Microlens and 3D-Printed Micro-objective as Integrated Bright Single-Photon Source", ACS Photonics, May 31, 2017, 6 pages.

* cited by examiner

METHOD FOR PRODUCING A RADIATION-EMITTING COMPONENT, AND RADIATION-EMITTING COMPONENT

CROSS-REFERENCE TO RELATED APPLICATION(S)

This patent application is a national stage entry from International Application No. PCT/EP2018/083029, filed on Nov. 29, 2018, published as International Publication No. WO 2019/110419 A1 on Jun. 13, 2019, and claims priority under 35 U.S.C. § 119 from German patent application 10 2017 128 824.4, filed Dec. 5, 2017, the entire contents of all of which are incorporated herein by reference.

A method for producing a radiation-emitting component is specified. In addition, a radiation-emitting component is specified.

An object to be achieved is to specify a method by means of which a radiation-emitting component having a predefined radiation distribution can be produced. Another object to be achieved is to specify a radiation-emitting component having a predefined radiation distribution.

These objects are achieved, inter alia, by the method and the subject matter of the independent patent claims. Advantageous embodiments and extensions are the subject matter of the dependent claims.

According to at least one embodiment, the method comprises a step A) in which a laser having an optical resonator and an output mirror is provided. In the intended operation, laser radiation is decoupled from the optical resonator via the output mirror. The laser radiation travels in particular perpendicular or transversely to a main extension plane of the output mirror.

The laser can be a laser diode or a semiconductor laser. The resonator is formed, in particular, by the semiconductor body of the laser diode. The output mirror is preferably formed by a facet or outer surface of the semiconductor body.

According to at least one embodiment, the method comprises a step B) in which a photoresist layer is applied to the output mirror. For example, the photoresist layer is sprayed on or laminated on. The photoresist layer can be applied directly to the output mirror or spaced apart from the output mirror.

The photoresist layer is, in particular, a 3D photoresist layer which can be structured using a 3D lithography process. In other words, the material of the photoresist layer can be chemically modified by an energy transfer, in particular by the absorption of electromagnetic radiation.

The material of the photoresist layer can be, in particular, an organic material such as a polymer or an epoxy resin. For example, the photoresist layer is applied with a thickness of at least 1 μm or at least 5 μm or at least 10 μm. Alternatively or in addition, the maximum thickness is 100 μm or 50 μm. The thickness is measured perpendicular to a main extension plane of the output mirror.

The photoresist layer is preferably applied over a large area of the output mirror, so that after step B) at least 60% or at least 80% or at least 90% of the output mirror is covered by the photoresist layer.

According to at least one embodiment, the method comprises a step C) in which an optical structure or an optical element is created from the photoresist layer by means of a 3D lithography process. The optical structure is configured to influence the beam path of the laser radiation by refraction and/or reflection. This means that the laser light emitted via the output mirror is incident on the optical structure and deflected by said optical structure by refraction and/or reflection.

3D lithography processes are also known by the term stereo lithography processes. For example, a specific location within a photoresist layer is exposed and chemically modified by means of a light source without exposing or chemically modifying the regions of the photoresist layer between that location and the light source. This can be carried out, for example, by focusing the light coming from the light source onto the location within the photoresist layer. In particular, in a 3D lithography process, not only is a lateral structure introduced into the photoresist layer, but also a depth structure. In this case, "lateral" means a direction parallel to the main extension plane of the photoresist layer, whereas the depth is specified in the direction perpendicular to the main extension plane.

Exposing specific locations within the photoresist layer changes their solubility to a solvent. The photoresist layer can be formed by a positive photoresist or a negative photoresist. In a negative photoresist, the solubility is decreased by exposure, while in a positive photoresist the solubility increases by exposure. After the exposure of the photoresist layer, the photoresist is developed. In this step the soluble regions are dissolved away by means of a solvent, so that only the insoluble regions, i.e. only the exposed or unexposed regions as appropriate, remain. These remaining regions form the optical structure, at least in part.

The optical structure is formed from the material of the original photoresist layer and is arranged in the beam path of the laser radiation emitted from the output mirror. The optical structure can have a maximum thickness, measured perpendicular to the main extension direction of the output mirror, of 70 μm, or no more than 50 μm, or no more than 40 μm. Alternatively or in addition, the thickness can be at least 0.5 μm or at least 1 μm or at least 5 μm. The thickness of the optical structure is preferably greater than the wavelength of the laser radiation.

The optical structure can be formed as a single part or a single piece of the material of the original photoresist layer. This means that all regions of the optical structure are formed integrally to each other and contain the same material or consist of the same material. However, the optical structure can also consist, for example, of a contiguous region of the material of the original photoresist, which is interspersed with spaces, such as gas-filled spaces.

In at least one embodiment, the method for producing a radiation-emitting component comprises a step A), in which a laser having an optical resonator and an output mirror is provided, wherein laser radiation is emitted from the optical resonator via the output mirror in the intended operation. In a step B), a photoresist layer is applied to the output mirror. In a step C) an optical structure is produced from the photoresist layer by means of a 3D lithography process, wherein the optical structure is configured to influence the beam path of the laser radiation by refraction and/or reflection.

The present invention is based in particular on the finding that the light output from an optical resonator, in particular a semiconductor laser, has a non-ideal far field due to beam divergence, inhomogeneous intensity distribution, et cetera. By using a high-resolution 3D lithography technique, micro-optics that influence the beam path and with dimensions typically less than or equal to 50 μm can be applied directly or indirectly to the output mirror of the optical resonator.

This means that the laser radiation coming out of the resonator can be collimated immediately after it emerges, for example.

According to at least one embodiment, the steps A) through C) are executed in the order indicated, one after the other.

Up to now, the information given has referred to one photoresist layer and one optical structure generated from the photoresist layer using a 3D lithography process. However, a plurality of photoresist layers can also be applied one after the other. In addition, a plurality of optical structures can be produced using a 3D lithography process. Therefore, all the information provided up to now and in the following for the one photoresist layer and the one optical structure can also apply to a plurality or to all photoresist layers, or to a plurality or all optical structures.

According to at least one embodiment, the 3D lithography process is a two-photon lithography process or a multi-photon lithography process. In this case the material of the photoresist layer is chemically modified by two-photon absorption or multi-photon absorption. In particular, laser radiation from a second laser is used, the wavelength of which is so large that the absorption of a photon is not sufficient to cause the chemical change in the photoresist. A chemical change can only be achieved by two-photon absorption or multi-photon absorption. By focusing the laser beam from the second laser at a focal point, the probability of two-photon absorption or multi-photon absorption can be significantly increased. If the focal point is then moved through the photoresist layer along the optical structure to be produced or along the negative form of the optical structure to be produced, only these regions will be exposed and chemically modified accordingly. A resolution in the sub-micron range can be achieved by this method. This means that optical structures can be produced with particular precision.

For example, if a UV-sensitive photoresist layer is used, then a 780 nm laser source can be used as a second laser. For example, a chemical change in the photoresist layer occurs due to two-photon absorption at a wavelength of 390 nm.

According to at least one embodiment, the optical structure, in particular the optical structure that is produced nearest to the output mirror, is produced at a distance of at least 1 µm or at least 2 µm or at least 5 µm or at least 10 µm from the output mirror. Alternatively or in addition, the distance from the optical structure to the output mirror is no more than 50 µm, or no more than 40 µm, or no more than 20 µm. Following the exit from the output mirror and before it is incident on the optical structure, the laser radiation thus preferably passes through a section, not formed by the photoresist, with a thickness corresponding to the distance just specified above. If the optical structure is spaced apart from the output mirror, the power density of the laser radiation emitted during operation that strikes the material of the optical structure is reduced, which also reduces the risk of a subsequent chemical modification of the material of the optical structure.

According to at least one embodiment, before step C), in particular before step B), at least one interface layer is applied to the output mirror, so that the photoresist layer is at a distance of at least 1 µm from the output mirror. The interface layer is preferably applied to the output mirror before the first photoresist layer is applied to the output mirror. The thickness of the interface layer is, in particular, at least 1 µm and no more than 50 µm.

The interface layer can be a passivation layer made of a dielectric material, such as aluminum oxide or silicon nitride or silicon oxide.

According to at least one embodiment, the interface layer has a different material composition than the photoresist layer. In particular, the interface layer is configured such that it does not change chemically under irradiation by radiation from the laser or radiation used for the 3D lithography process.

In particular, the interface layer can be chosen such that it increases or causes the adhesion of the photoresist layer to the output mirror. In addition, the interface layer may be selected to have a different reflectivity and/or a different refractive index for the laser radiation than the photoresist layer.

According to at least one embodiment, a plurality of optical structures are each produced by means of a 3D lithography process.

According to at least one embodiment, the optical structures are arranged one behind the other in the beam direction of the laser radiation. In other words, during operation the laser radiation from the laser passes through the optical structures one after the other. For example, three or more or four or more or five or more optical structures are arranged one after another.

According to at least one embodiment, an intermediate space is formed between two optical structures, in particular between each two optical structures. In order to travel from one optical structure to the other optical structure, at least part of the laser radiation from the laser must pass through the intermediate space. The intermediate space can be filled with a gas, such as air. In the transition from an optical structure to an intermediate space a refractive index jump occurs, which results in a refraction and/or reflection of the laser light.

If the optical structures are lenses, the arrangement of a plurality several lenses in succession and intermediate spaces can result in the formation of a micro-objective for the laser radiation emitted by the laser.

According to at least one embodiment, the multiple optical structures are produced from a single contiguous photoresist layer. In order to dissolve the soluble photoresist material from the regions between the optical structures, the 3D lithography process is used, for example, to create channels in the photoresist layer, through which the soluble photoresist material can be transported away. The channels preferably extend in a direction transverse or perpendicular to the main extension plane of the output mirror.

The channels just mentioned can also be formed in all other cases in which a plurality of optical structures are not produced from a single contiguous photoresist layer. In particular when the optical structure is generated at a distance from the output mirror, one or more such channels can be useful.

When using a single photoresist layer to produce multiple successively arranged optical structures, the optical structures can be formed such that they are contiguously connected to one another.

According to at least one embodiment, two optical structures are produced from two photoresist layers applied consecutively and one behind the other in the beam direction. The photoresist layers can be spaced apart from each other.

According to at least one embodiment, the photoresist layer applied further away from the output mirror is only applied after the optical structure has been produced in the photoresist layer applied closer to the output mirror. This means that the first photoresist layer is exposed and developed before the second photoresist layer is applied.

According to at least one embodiment, between two successively applied photoresist layers, in particular between each two successively applied photoresist layers, an interface layer is applied which has a different material composition than the photoresist layers. The interface layer can be made of one of the above-mentioned materials and have one of the above-mentioned thicknesses. The refractive index of the interface layer is preferably different from that of the optical structures.

For example, a photoresist layer is applied first and then an optical structure is produced by means of 3D photolithography, by exposure and development of the photoresist layer. The interface layer is applied thereafter. After applying the interface layer, a further photoresist layer is applied and then exposed and developed.

Alternatively, however, the two photoresist layers and the interface layer can be applied first, and only then are the photoresist layers exposed and developed, or structured using 3D photolithography.

According to at least one embodiment, the laser is a laser diode or a semiconductor laser. The laser diode can be an edge-emitting laser diode, in particular a laser bar. Alternatively, the laser diode is a surface-emitting laser diode, i.e. a so-called VCSEL.

According to at least one embodiment, the output mirror is formed by a facet of a semiconductor body. The facet is, in particular, a fracture surface or fracture facet of the semiconductor body.

The semiconductor body may comprise a semiconductor layer sequence with an active layer for generating electromagnetic radiation. The semiconductor layer sequence is based on a III-V compound semiconductor material, for example. The semiconductor material can be, for example, a nitride compound semiconductor material, such as $Al_nIn_{1-n-m}Ga_mN$ or a phosphide compound semiconductor material such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, where in each case $0 \leq n \leq 1$, $0 \leq m \leq 1$ and $m+n \leq 1$. In this case, the semiconductor layer sequence can comprise dopants and additional components. For the sake of simplicity, however, only the essential complements of the crystal lattice of the semiconductor layer sequence, thus Al, As, Ga, In, N or P are given, even if these may be partially supplemented and/or replaced by trace amounts of other substances. The semiconductor layer sequence is preferably based on AlInGaN.

In particular, the active layer of the semiconductor layer sequence contains at least one pn-junction and/or at least one quantum well structure and when operated as intended, for example, can generate electromagnetic radiation in the blue or green or red spectral range or in the UV range or in the IR range.

The active layer preferably extends along a main extension plane of the semiconductor body or the laser. The facet or the output mirror preferably extends perpendicular or transverse to the main extension plane of the active layer. In particular, the active layer adjoins the output mirror and forms part of the output mirror.

According to at least one embodiment, the optical structure is a lens for deflecting the laser radiation. The lens consists, in particular, of the material of the original photoresist layer. For example, the lens comprises a radiation entry surface facing the output mirror, and a radiation exit surface facing away from the output mirror. During operation, the laser radiation enters the lens via the radiation entry surface, and the laser radiation then exits the lens again from the radiation exit surface. The medium adjoining the radiation entry surface and/or the radiation exit surface is preferably a gas, such as air. The lens can have a diameter of at least 10 μm or at least 30 μm or at least 50 μm. Alternatively or in addition, the diameter can be no more than 250 μm or no more than 200 μm or no more than 150 μm. The diameter is preferably measured parallel to the main extension plane of the output mirror.

The radiation entry surface and/or the radiation exit surface may be curved, for example convex or concave. Also, the radiation entry surface and/or the radiation exit surface may have both convex and concave curved sections. For example, the lens can be a plane convex or plane concave or bi-concave or bi-convex or concave-convex lens. In particular, curved surfaces can be produced in a controlled manner using the 3D lithography process.

According to at least one embodiment, the optical structure is a wavelength-selective optical element with a plurality of single layers arranged one behind the other and spaces between the individual layers. The optical structure can be, for example, a Bragg mirror or a Fabry-Perot interferometer for the laser radiation of the laser. The thickness of the individual layers is preferably less than the wavelength or less than half the wavelength of the laser light, for example less than 1 μm. The thickness of the intermediate spaces is then preferably also less than the wavelength or half the wavelength of the laser light, particularly preferably less than 1 μm.

For example, the gaps are filled with gas, such as air. The individual layers are preferably made from the material of the photoresist layer. In particular, the individual layers each have two main sides which are planar and parallel within the manufacturing tolerance, arranged one behind the other along the beam direction.

According to at least one embodiment, in step A) a plurality of lasers is provided, each having a resonator and an output mirror. For example, a plurality of laser diode chips are provided. However, the lasers can also be connected. The lasers are then preferably individual emitters of a laser bar.

According to at least one embodiment, in step B) the resist layer is applied to the output mirrors of a plurality of lasers as a contiguous, in particular simply contiguous, layer.

According to at least one embodiment, in step C) a separate optical structure is inserted into the photoresist layer for each laser or for different groups of lasers. This means that using the method, optical structures for a plurality of lasers are produced simultaneously or in parallel. A group of lasers can be provided with a common optical structure, such as a common lens or a common Bragg mirror or a common Fabry-Perot interferometer. However, a single uniquely assigned optical structure, such as a separate lens or a separate Bragg mirror or a separate Fabry-Perot interferometer, can also be produced for each of a plurality of lasers.

In this case, the exposure of the contiguous coating layer is preferably carried out first and then the entire contiguous resist layer is developed.

In addition, a radiation-emitting component is specified. The component can be produced, in particular, with the method described here. This means that all the features disclosed in connection with the method are also disclosed for the radiation-emitting component and vice versa.

According to at least one embodiment, the radiation-emitting component comprises a laser with an optical resonator and an output mirror. In the intended operation, laser radiation exits from the optical resonator via the output mirror.

According to at least one embodiment, the radiation-emitting component comprises an optical structure or an optical element on the output mirror.

According to at least one embodiment, the optical structure is designed to influence the beam path of the laser radiation coming from the output mirror by refraction and/or reflection.

According to one embodiment the optical structure comprises or consists of a cured photoresist material. A cured photoresist material here is understood to mean the material of a photoresist that has remained after an exposure and development process. In particular, the cured photoresist material is not soluble or only weakly soluble in the solvent that is usually used to develop the photoresist. In particular, the optical structure comprises or consists of a polymer or a resin.

According to at least one embodiment, at least one interface layer is applied to the output mirror and between the optical structure and the output mirror, so that the photoresist layer is at a distance of at least 1 µm from the output mirror. The interface layer has, in particular, a different material composition than the photoresist layer.

According to at least one embodiment, the optical structure is a lens with a curved radiation entry surface and/or a curved radiation exit surface.

According to at least one embodiment, the optical structure is a wavelength-selective optical element with a plurality of single layers arranged one behind the other and with spaces between the individual layers.

According to at least one embodiment, the optical structure is produced by means of a 3D lithography process.

According to at least one embodiment the optical structure is surrounded, in particularly completely surrounded, in a direction parallel to a main extension plane of the output mirror by a stabilization layer made of the cured photoresist material and is in direct contact with the stabilization layer. The optical structure is preferably formed from a single piece or as a single part with the stabilization layer, or is contiguous with it. The stabilization layer is, in particular, the residue of the original photoresist layer, which like the optical structure was not dissolved by the solvent and remains on the output mirror to stabilize the optical structure.

The stabilization layer can partially cover the output mirror, as seen from above the output mirror. In particular, the stabilization layer can be limited to the region of the output mirror, i.e. it does not extend beyond the output mirror in a direction parallel to the main extension plane of the output mirror. The stabilization layer can rest directly on the output mirror or on the interface layer.

In the intended operation, the laser radiation of the laser preferably does not pass through the stabilization layer. The stabilization layer together with the optical structure preferably covers at least 50% or at least 75% or at least 80% of the output mirror.

According to one embodiment, one or more channels are formed between the optical structure and the stabilization layer. The channels preferably extend in a direction transverse or perpendicular to the main extension plane of the output mirror. The channels are preferably filled channels, via which the soluble photoresist material can be transported away during the production of the optical structure.

In the following a method described here for producing a radiation-emitting component and a radiation-emitting component described here are explained in more detail with reference to drawings based on exemplary embodiments. Identical reference signs indicate the same elements in the individual figures. The represented elements are not shown true to scale, however; rather, individual elements can be represented in exaggerated size for improved comprehension.

Figure 1B:
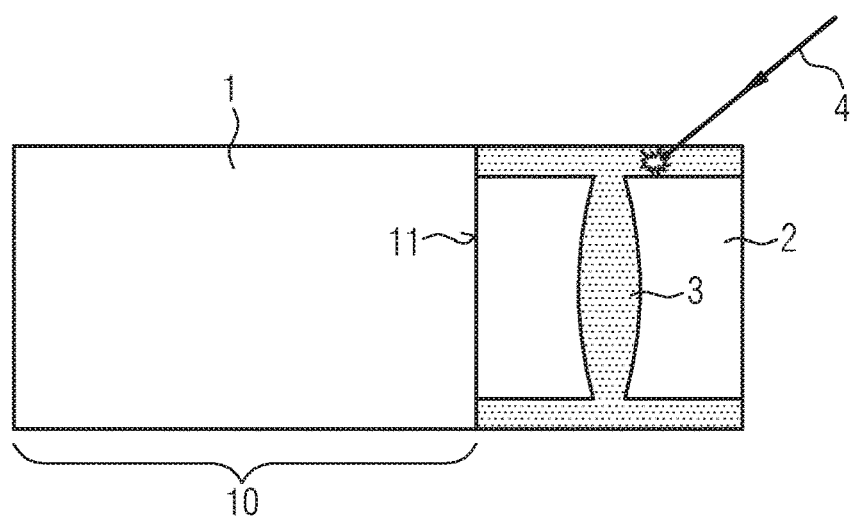
Figure 1C:
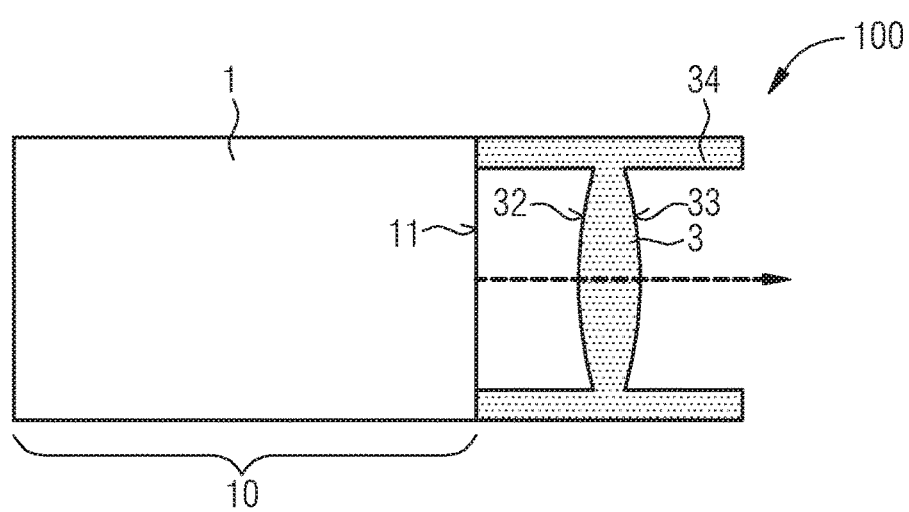

In the drawings:

FIGS. 1A to 1C show different positions in an exemplary embodiment of the method for producing a radiation-emitting component, FIGS. 2A to 5G show exemplary embodiments of a radiation-emitting component in side view and plan view.

FIG. 1A shows a first position in the method, in which a laser 1 is provided. The laser 1 comprises a resonator 10 and an output mirror 11. In the intended operation of the laser 1, laser radiation 11 exits from the resonator 10 via the output mirror.

A photoresist layer 2 is applied to the output mirror 11. The photoresist layer 2 comprises a polymer or an epoxy resin, for example.

FIG. 1B shows a second position of the method. A 3D lithography process is applied to the photoresist layer 2. It is apparent how the focal point of a laser beam 4 of a second laser reproduces a three-dimensional optical structure 3 within the photoresist layer 2. The incidence of the laser beam 4 alters the chemical structure of the photoresist layer 2. For example, in the present case a two-photon lithography process is used, in which a chemical alteration of the photoresist layer 2 occurs only in the area of the focal point of the laser beam 4. This allows areas inside the photoresist layer 2 to be exposed and chemically altered without any exposure or chemical change occurring along the laser beam 4 as a whole.

FIG. 1C shows a third position of the method. After the exposure of the photoresist layer 2 with the laser beam 4, the photoresist layer 2 has been developed. For this purpose, for example, a solvent was introduced into the photoresist layer 2. The non-exposed areas have been dissolved away by the solvent. Only the optical structure 3, which is reproduced by the focal point of the laser beam 4, remains.

In this case, optical structure 3 is a bi-convex lens, which covers part of the output mirror 11 and is arranged in the beam path of the laser radiation emerging from the laser 1 (dashed arrow). Both a radiation entry surface 32 and a radiation exit surface 33 have an end-to-end convex curvature.

FIG. 1C shows a finished radiation-emitting component 100.

Figure 2A:
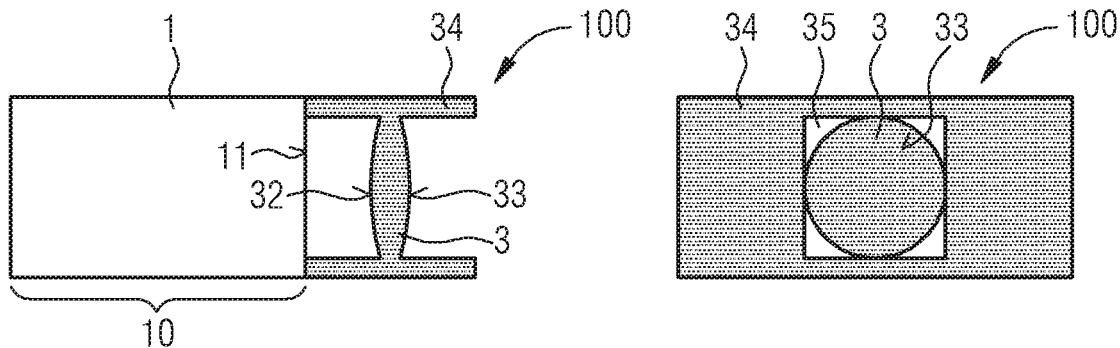

FIG. 2A shows the radiation-emitting component 100 of FIG. 1C once again. A side view of the component 100 is shown on the left. On the right, the plan view of the output mirror 11 is shown. In the image on the right therefore, the laser radiation exits from the plane of the drawing.

As can be seen in the plan view of the right-hand picture of FIG. 2A, the optical structure 3 is completely surrounded laterally by a stabilization layer 34. The stabilization layer 34 consists of the cured material of the photoresist layer 2. The regions of the stabilization layer 34 have also been exposed, for example. The laser beam emitted from the laser 1 only passes through the optical structure 3, but not the stabilization layer 34. The stabilization layer 34 is in direct contact with the optical structure 3 and stabilizes the optical structure 3 on the output mirror 11. The stabilization layer 34 together with the optical structure 3 cover, for example, at least 75% of the output mirror 11.

Between the optical structure 3 and the stabilization layer 34, cavities 35 or channels 35 are formed, via which the solvent can also reach behind the optical structure 3 during the development process.

Figure 2B:
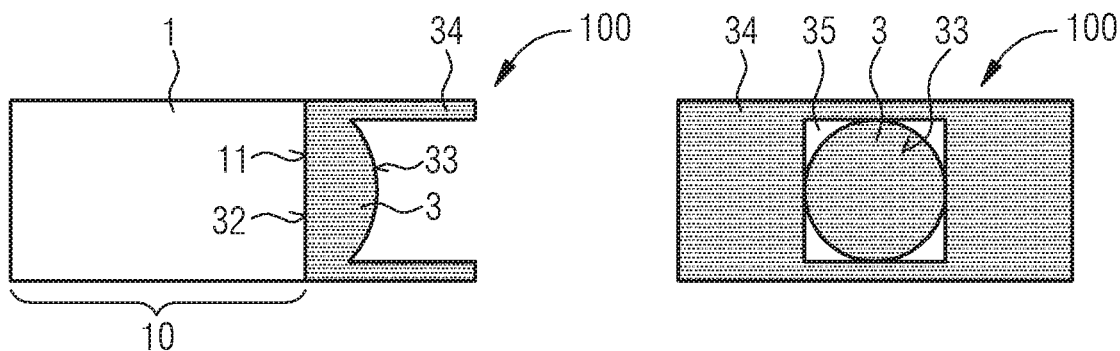

FIG. 2B shows another exemplary embodiment of a radiation-emitting component 100 in side view and plan view. In this case, the optical structure 3 is a plane-convex lens, wherein the radiation entry surface 32 is planar within the manufacturing tolerance and the radiation exit surface 33 has an end-to-end convex curvature. The radiation entry surface 32 is in direct contact with the output mirror 11.

Figure 2C:
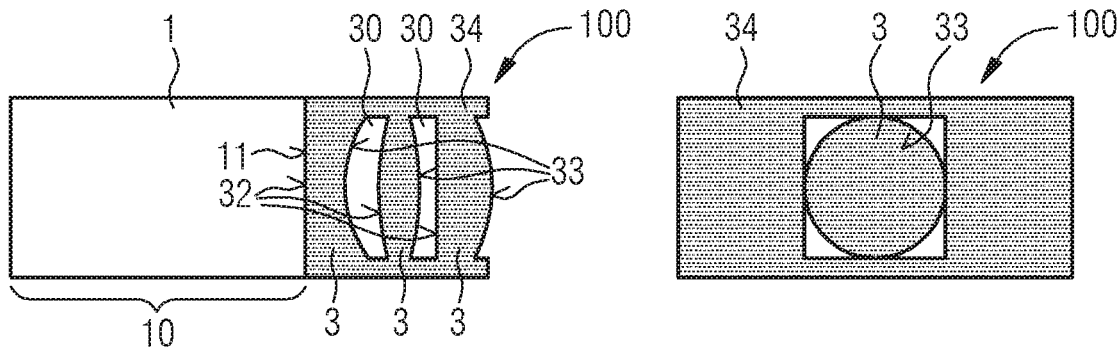

FIG. 2C shows another exemplary embodiment of a radiation-emitting component 100 in side view and plan view. The manufacturing process described above is used to produce a plurality of optical structures 3, each in the form of a lens. The optical structures 3 are produced from a single, contiguous photoresist layer 2. The lenses 3 are arranged one behind the other along the beam direction, so that in the intended operation the laser radiation emerging from the resonator 10 passes through all lenses 3 in succession. The lenses 3 are spaced apart from each other by an intermediate space 30. For example, the intermediate space 30 is filled with air. The lenses 3 are connected together.

The first lens 3, viewed along the beam direction, is a plane-concave lens. The second lens 3 is a bi-convex lens. The third lens 3 is a plane-convex lens. The three lenses together form a micro-objective.

Figure 3:
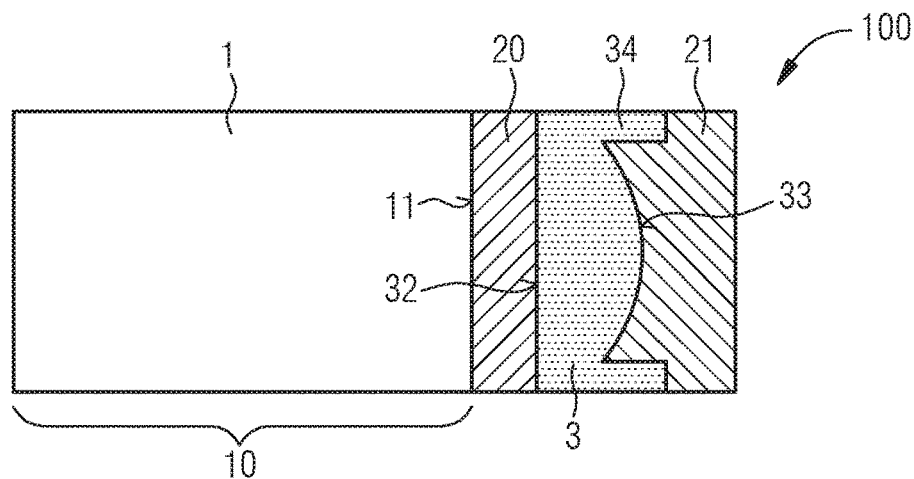

FIG. 3 shows a further exemplary embodiment of a radiation-emitting component 100 in side view, in which the optical structure 3, here a plane-convex lens, arranged closest to the output mirror 11 is separated from the output mirror 11 by an interface layer 20. The interface layer 20 is between 1 μm and 20 μm thick, for example. In particular, the interface layer 20 can be a passivation layer, for example made of aluminum oxide or silicon nitride. Because the optical structure 3 is separated from the output mirror 11, the intensity of the laser radiation incident on the material of the optical structure 3 is reduced, which reduces the risk of damage to the optical structure 3.

A covering layer 21 is applied to the side of the optical structure 3 facing away from the output mirror 11. The covering layer 21 completely covers the optical structure 3. The covering layer 21 can again be a passivation layer, for example, made of one of the above-mentioned materials, and can be used to protect the optical structure 3.

The covering layer 21 and the interface layer 20 preferably consist of a material transparent to the laser radiation of the laser 1.

Figure 4:
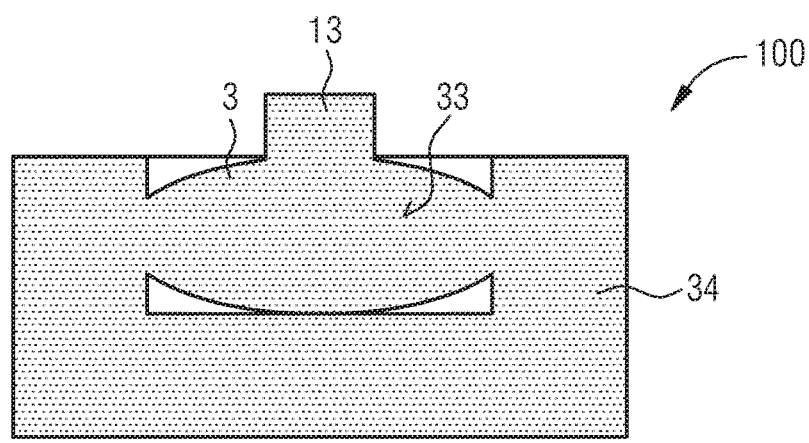

FIG. 4 shows another exemplary embodiment of a radiation-emitting component 100 viewed from above the output mirror 11 or from above the radiation-emitting surface 33 of the optical structure 3. Again, it is apparent that the optical structure 3 is surrounded on all sides by the stabilization layer 34 formed by the cured photoresist. In addition, it is apparent that the laser 1 comprises a ridge 13 (so-called ridge-type laser). The ridge 13 is also covered by the stabilization layer 34. The radiation exit surface 33 is elliptical.

In each of FIGS. 5A to 5G, the laser 1 is either a laser diode or a semiconductor laser. The resonator 10 is formed by a semiconductor body 12. The laser 1 comprises two opposing output mirrors 11, which are each formed by facets or fracture surfaces of the semiconductor body 12. In all of the exemplary embodiments described above, the laser can be such a semiconductor laser.

The semiconductor body 12 comprises semiconductor layers 16, between which an active layer 17 is formed.

During operation, the laser radiation is generated in the active layer 17. The semiconductor layers 16 act as waveguides. The semiconductor layers 16 and the active layer 17 are arranged on a substrate 18, such as a growth substrate. A first electrode 15 and a second electrode 19 are provided on the upper and lower sides of the semiconductor body 12 for electrically contacting the laser 1.

Figure 5A:
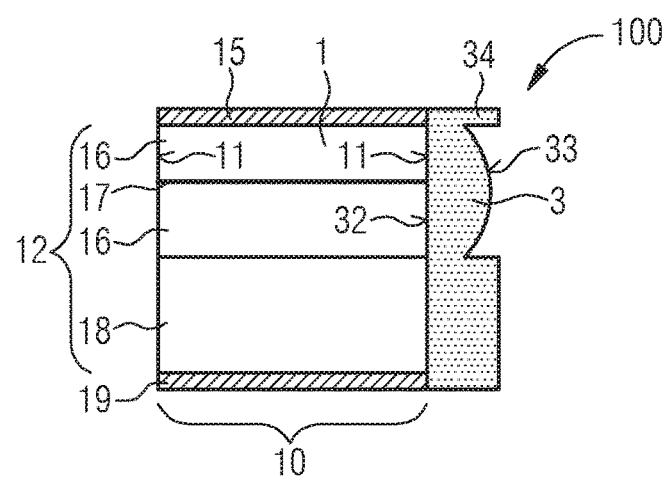

In the exemplary embodiment shown in FIG. 5A, an optical structure 3 in the form of a plane-convex lens is formed on a first output mirror 11. The plane-convex lens is arranged in the region of the active layer 17. In directions parallel to the main extension plane of the output mirror 11, the optical structure 3 is again surrounded by the stabilization layer 34.

Figure 5B:
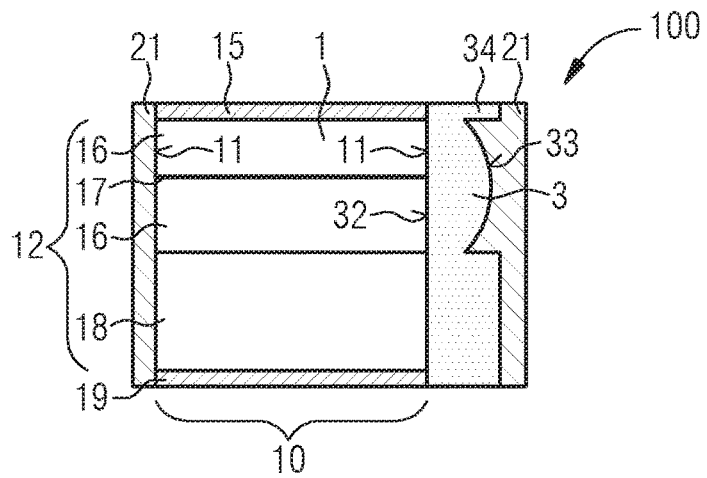

FIG. 5B shows a further exemplary embodiment of a radiation-emitting component 100. The component 100 of FIG. 5B comprises the same elements as the component 100 of FIG. 5A. In addition, a covering layer 21 is provided on the optical structure 3. A covering layer 21 is also provided on the second output mirror 11 on the opposite side.

Figure 5C:
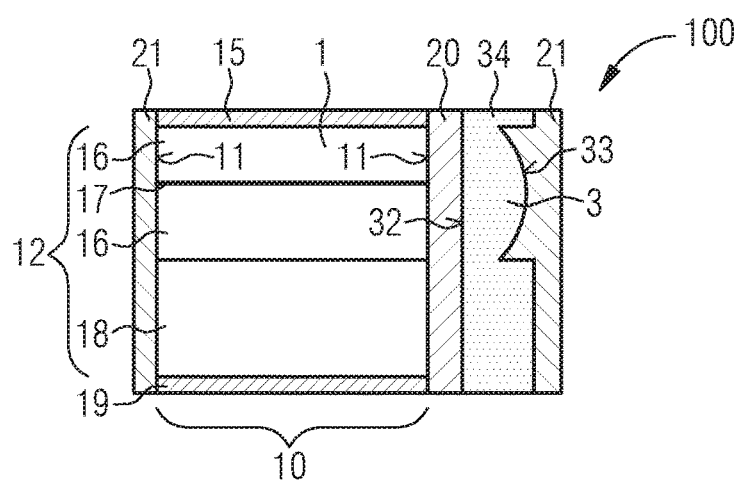

In FIG. 5C, in contrast to FIG. 5B, a further interface layer 20 is arranged between the optical structure 3 and the semiconductor body 12.

Figure 5D:
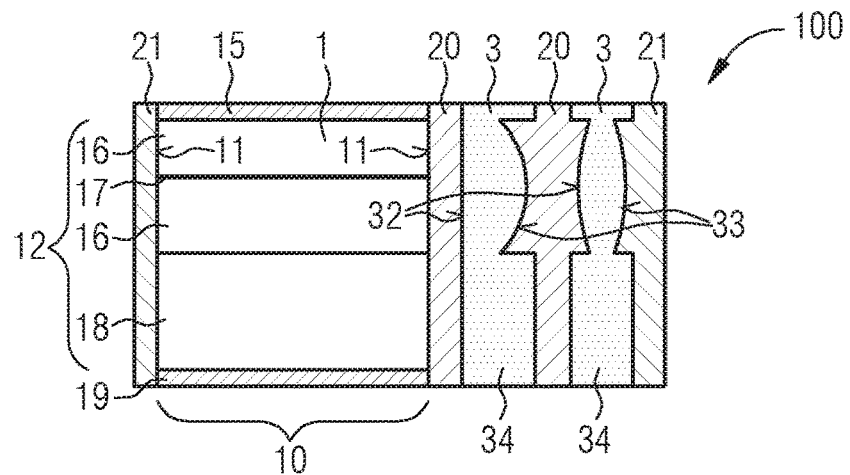

In the exemplary embodiment of FIG. 5D, two optical structures 3 are provided, arranged one behind the other in the direction of the beam. The optical structures 3 are manufactured from different photoresist layers 2. The optical structures 3 are separated from each other by an interface layer 20.

Figure 5E:
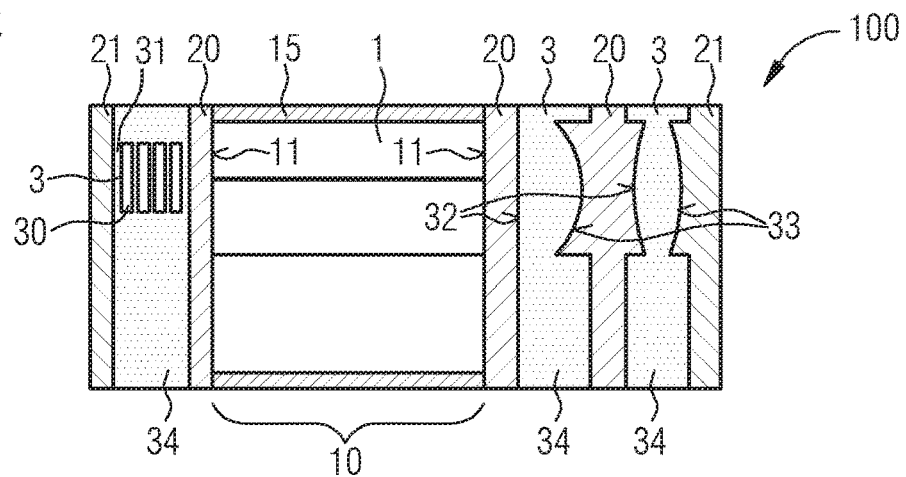

The exemplary embodiment of FIG. 5E comprises the same components as the component 100 of FIG. 5D. In addition, however, a further optical structure 3 made from a photoresist layer 2 is produced on the second output mirror 11. The optical structure 3 is a wavelength-selective optical element having a plurality of individual layers 31 of the photoresist material. The individual layers 31 are connected together and are formed from a single, contiguous photoresist layer 2. The individual layers 31 are separated from each other by gas-filled intermediate spaces 30. The optical structure 3 is, for example, a Bragg mirror for the laser radiation emitted from the laser 1 in the region of the second output mirror 11.

Figure 5F:
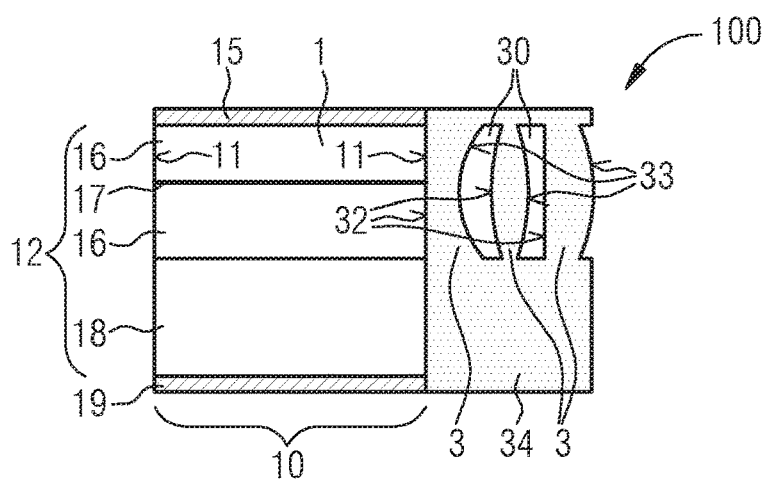

FIG. 5F shows an exemplary embodiment in which again a plurality of optical structures 3, each in the form of lenses, are formed on one of the output mirrors 11. The lenses 3 are formed from a single, contiguous photoresist layer 2. Between the lenses 3, gas-filled or air-filled intermediate spaces 30 are formed.

Figure 5G:
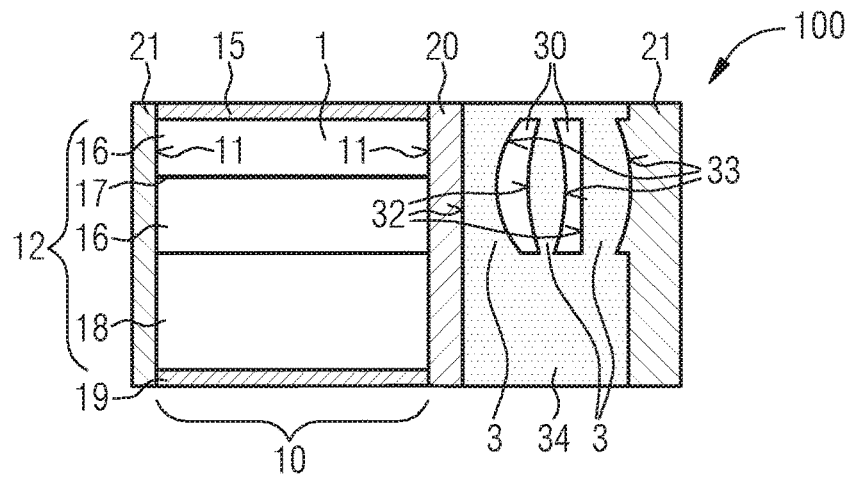

The exemplary embodiment of FIG. 5G corresponds essentially to the exemplary embodiment of FIG. 5F. Unlike in FIG. 5F, however, an interface layer 20 is provided between the optical structures 3 and the output mirror 11. A covering layer 21 is attached on a side of the optical structures 3 facing away from the output mirror 11. A further covering layer 21 is arranged on the second output mirror 11.

The invention is not limited to the embodiments by the fact that the description is based on them. Rather, the invention comprises each new feature, as well as any combination of features, which includes in particular every combination of features in the patent claims, even if these features or this combination itself is not explicitly specified in the patent claims or exemplary embodiments.

LIST OF REFERENCE SIGNS 1 laser
2 3D lithography layer 3 optical structure
4 light beam
10 resonator
11 output mirror
12 semiconductor body
13 ridge
15 first electrode
16 semiconductor layer
17 active layer
18 substrate
19 second electrode
20 interface layer
21 covering layer
30 intermediate space
31 single layer
32 radiation entry surface
33 radiation exit surface
34 stabilizing layer
35 channel
100 radiation-emitting component

The invention claimed is:

1. A method for producing a radiation-emitting component, comprising the steps:
   A) providing a laser having an optical resonator and an output mirror, via which laser radiation from the optical resonator exits during the intended operation;
   A2) applying a first interface layer to the output mirror;
   B) applying a 3D photoresist layer to the first interface layer;
   C) generating an optical structure in the 3D photoresist layer by a 3D lithography process, wherein the optical structure is configured to influence the beam path of the laser radiation by refraction and/or reflection,
   wherein the 3D photoresist layer is at a distance of at least 1 µm from the output mirror,
   wherein the first interface layer and the optical structure are composed of different materials,
   wherein a plurality of optical structures are each produced by the 3D lithography process, the plurality of optical structures form a wavelength-selective optical element having a plurality of single layers with parallel sides arranged one behind the other and intermediate spaces between the individual layers,
   wherein two optical structures of the plurality of optical structures are created from two photoresist layers applied consecutively and one behind the other in the beam direction, the photoresist layer applied further away from the output mirror is only applied after the optical structure has been created in the photoresist layer applied closer to the output mirror.

2. The method as claimed in claim 1,
   wherein the 3D lithography process is a two-photon lithography process or a multi-photon lithography process.

3. The method as claimed in claim 1, wherein the optical structure is produced at a distance of at least 1 µm and not more than 50 µm from the output mirror.

4. The method as claimed in claim 3, wherein the first interface layer has a different material composition than the 3D photoresist layer.

5. The method as claimed in claim 1,
   wherein a second interface layer is applied between the consecutively applied photoresist layers, which has a different material composition than the photoresist layers.

6. The method as claimed in claim 1, wherein the laser is a laser diode, the output mirror is a facet of a semiconductor body.

7. The method as claimed in claim 1, wherein
   in step A), a plurality of lasers are provided, each with a resonator and an output mirror,
   in step B) the 3D photoresist layer is applied to the output mirrors of a plurality of lasers as a contiguous layer.

8. The method as claimed in claim 7, wherein
   in step C), a separate optical structure is inserted into the 3D photoresist layer for each laser or for different groups of lasers.

9. The method as claimed in claim 1, wherein the first interface layer is a passivation layer made of aluminum oxide, silicon nitride, or silicon oxide and wherein the first interface layer provide adhesion of the 3D photoresist layer to the output mirror.

10. A radiating-emitting component, comprising:
    a laser having an optical resonator and an output mirror, via which a laser radiation from the optical resonator exits during an intended operation;
    an interface layer on the output mirror; and
    an optical structure spaced at a distance by the interface layer from the output mirror, wherein
    the optical structure is designed to influence a beam path of the laser radiation emerging from the output mirror by refraction and/or reflection,
    the optical structure comprises a cured photoresist material,
    wherein the interface layer and the optical structure are composed of different materials,
    wherein the optical structure is a wavelength-selective optical element having a plurality of single layers with parallel sides arranged one behind another, and intermediate spaces between the individual layers.

11. The radiating-emitting component as claimed in claim 10,
    wherein the optical structure is produced by means of a 3D lithography process.

12. The radiating-emitting component as claimed in claim 10,
    wherein the optical structure is surrounded in directions parallel to a main extension plane of the output mirror by a stabilization layer made of the cured photoresist material and is in direct contact with the stabilization layer.

13. The radiating-emitting component as claimed in claim 12, wherein between the optical structure and the stabilization layer one or more channels are arranged, which extend transverse or perpendicular to the main extension plane of the output mirror.

14. The radiating-emitting component as claimed in claim 10, wherein the optical structure is a Bragg mirror or a Fabry-Perot interferometer.

15. A method for producing a radiation-emitting component, the method comprising:
    providing a laser having an optical resonator and an output mirror, via which laser radiation from the optical resonator exits during the intended operation;
    applying a first interface layer to the output mirror;
    applying a 3D photoresist layer to the first interface layer;
    generating an optical structure in the 3D photoresist layer by a 3D lithography process, wherein the optical structure is configured to influence the beam path of the laser radiation by refraction and/or reflection,
    wherein the 3D photoresist layer is at a distance of at least 1 µm from the output mirror,
    wherein the optical structure is a wavelength-selective optical element having a plurality of single layers with parallel sides arranged one behind another, and intermediate spaces between the individual layers.

* * * * *